(12) United States Patent
Vashishtha

(10) Patent No.: US 9,843,321 B2
(45) Date of Patent: Dec. 12, 2017

(54) SYSTEM AND METHOD FOR A PRE-DRIVER CIRCUIT

(71) Applicant: STMICROELECTRONICS INTERNATIONAL N.V., Amsterdam (NL)

(72) Inventor: Sameer Vashishtha, Greater Noida (IN)

(73) Assignee: STMicroelectronics International B.V., Amsterdam (NL)

( * ) Notice: Subject to any disclaimer, the term of this patent is extended or adjusted under 35 U.S.C. 154(b) by 0 days.

(21) Appl. No.: 15/265,627

(22) Filed: Sep. 14, 2016

(65) Prior Publication Data

US 2017/0005655 A1    Jan. 5, 2017

Related U.S. Application Data

(63) Continuation of application No. 14/166,615, filed on Jan. 28, 2014, now Pat. No. 9,473,134.

(51) Int. Cl.
| | |
|---|---|
| *H03B 1/00* | (2006.01) |
| *H03K 3/00* | (2006.01) |
| *H03K 17/687* | (2006.01) |
| *H03K 19/0185* | (2006.01) |
| *H03K 5/12* | (2006.01) |

(52) U.S. Cl.
CPC ........... *H03K 17/687* (2013.01); *H03K 5/12* (2013.01); *H03K 19/0185* (2013.01); *H03K 19/018507* (2013.01)

(58) Field of Classification Search
CPC ....... H03K 19/00361; H03K 19/00315; H03K 17/063; H04L 25/0278; H04L 25/0269
USPC .................. 327/108–112, 172, 175
See application file for complete search history.

(56) References Cited

U.S. PATENT DOCUMENTS

| | | |
|---|---|---|
| 5,621,342 A | 4/1997 | Wong et al. |
| 6,707,727 B2 | 3/2004 | Tamura et al. |
| 6,801,065 B2 | 10/2004 | Hoshino et al. |
| 6,870,390 B1 | 3/2005 | Groen et al. |

(Continued)

FOREIGN PATENT DOCUMENTS

WO    2012072726 A1    6/2012

OTHER PUBLICATIONS

Kamel, D., et al., "Enhanced performance of SERDES current-mode output driver using 0.13 µm PD SOI CMOS," 2009 IEEE International SOI Conference, Oct. 5-8, 2009, Foster City, CA, pp. 1-2.

(Continued)

*Primary Examiner* — Lincoln Donovan
*Assistant Examiner* — Diana J Cheng
(74) *Attorney, Agent, or Firm* — Slater Matsil, LLP

(57) ABSTRACT

A drive circuit includes an input, a driver, a first buffer, a second buffer, a first capacitance element, and a second capacitance element. The driver includes a first PMOS transistor and a first NMOS transistor coupled in series between a supply terminal and a reference terminal. The first buffer is coupled between the input and a control terminal of the first PMOS transistor. The second buffer is coupled between the input and a control terminal of the first NMOS transistor. The first capacitance element is coupled to the control terminal of the first PMOS transistor through a first semiconductor switch. The second capacitance element is coupled to the control terminal of the first NMOS transistor through a second semiconductor switch.

20 Claims, 10 Drawing Sheets

(56) References Cited

U.S. PATENT DOCUMENTS

| | | |
|---|---|---|
| 6,906,567 B2 | 6/2005 | Culler |
| 7,410,840 B2 | 8/2008 | Tigelaar |
| 7,477,083 B2 | 1/2009 | Fujisawa et al. |
| 7,786,779 B2 | 8/2010 | Chang et al. |
| 8,742,803 B2 | 6/2014 | Schuler |
| 2007/0013411 A1 | 1/2007 | Asaduzzaman et al. |
| 2008/0303558 A1 | 12/2008 | Rho |
| 2009/0167368 A1 | 7/2009 | Chan et al. |
| 2012/0146686 A1 | 6/2012 | Maarouf |

OTHER PUBLICATIONS

SOI Industry Consortium, "Considerations for Bulk CMOS to FD-SOI Design Porting," Release 0.1.a, Sep. 2011, pp. 1-29.
STlife.augmented, "Brushless/sensorless 3-phase motor pre-driver for automotive applications" Datasheet, L99ASC03, DocID023504 Rev 5, www.st.com, Nov. 2013, pp. 1-72.

SYSTEM AND METHOD FOR A PRE-DRIVER CIRCUIT

CROSS-REFERENCE TO RELATED APPLICATIONS

This application is a continuation of U.S. patent application Ser. No. 14/166,615, filed on Jan. 28, 2014, which application is hereby incorporated herein by reference.

TECHNICAL FIELD

The present invention relates generally to electronic circuits and, in particular embodiments, to a system and method for a pre-driver circuit.

BACKGROUND

In many types of electronic circuits, a driver may be used to interface a control signal with a switch or output, for example. In some specific examples, drivers are used as output buffers for integrated circuits (ICs). In such examples, a driver is coupled to the output and configured to supply or drive an output that may be coupled to any type of electronic component, such as another IC, sensor, display, or actuator. In many instances, numerous components are coupled to an electronic bus that can convey signals between the components attached to the bus. In such cases, drivers are used to supply the signals originating at the components to the bus. Drivers may be operated to perform according to numerous specifications, such as operating with a specific output voltage and/or current, for example.

In some example implementations, drivers may operate at a higher voltage, current, and/or power rating than other electronic elements configured to supply control or drive signals to the driver. An element known as a pre-driver may be used before a driver in order to more precisely control the driver, e.g., because the electronic properties of the driver may not exactly match the other electronic elements of the system. The pre-driver is coupled to the driver and supplies the control signals to the driver circuit. A pre-driver may be configured to affect switching characteristics, such as on-time, rise-fall time, propagation delay, short circuit current, or other characteristics, for example.

A driver may be configured to provide an output signal and drive a bus connection while a pre-driver controls the driver based on signals received from digital electronics in the core of an IC. Pre-driver engineering often requires substantial balancing of beneficial performance characteristics and presents challenges suitable for inventive solutions.

SUMMARY OF THE INVENTION

A number of embodiments are disclosed herein.

A first embodiment relates to a drive circuit configured to drive an output line. A driver circuit includes a first PMOS transistor and a first NMOS transistor. The first PMOS transistor and the first NMOS transistor are coupled in series between a supply terminal and a reference terminal. A first buffer is coupled between the input and a control terminal of the first PMOS transistor. A second buffer is coupled between the input and a control terminal of the first NMOS transistor. A first capacitance element is coupled to the control terminal of the first PMOS transistor through a first semiconductor switch and a second capacitance element is coupled to the control terminal of the first NMOS transistor through a second semiconductor switch.

In various embodiments, the first and/or second capacitance elements can be formed from FD SOI transistors. For example, the first capacitance element can comprise a first fully depleted silicon-on-insulator (FD-SOI) transistor that includes a gate coupled to the control terminal of the first PMOS transistor and a source and drain coupled to a first reference terminal. The second capacitance element can comprise a second FD-SOI transistor that includes a gate coupled to the control terminal of the first NMOS transistor and a source and drain coupled to a second reference terminal.

In another embodiment, a pre-driver circuit includes first buffer coupled between an input terminal and a PMOS drive terminal and a second buffer coupled between the input terminal and an NMOS drive terminal. A first fully depleted silicon-on-insulator (FD-SOI) transistor includes a gate, source, and drain, where the source and drain are coupled to a first reference terminal. A first semiconductor switch has a conduction path coupled between the gate of the first FD-SOI transistor and the PMOS drive terminal. A second FD-SOI transistor includes a gate, source, and drain, where the source and drain are coupled to a second reference terminal. A second semiconductor switch has a conduction path coupled between the gate of the second FD-SOI transistor and the NMOS drive terminal.

Other embodiments are disclosed herein.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of various embodiments are discussed in detail below. It should be appreciated, however, that the various embodiments described herein are applicable in a wide variety of specific contexts. The specific embodiments discussed are merely illustrative of specific ways to make and use various embodiments, and should not be construed in a limited scope.

Description is made with respect to various embodiments in a specific context, namely input/output (I/O) circuits and interface circuits, and more particularly, pre-driver circuits. Some of the various embodiments described herein include drivers, pre-drivers, I/O interface circuits, variable capacitance pre-drivers, variable capacitance pre-drivers in fully depleted silicon-on-insulator (FD-SOI) integrated circuits, inverting drivers, and pre-drivers for bus interfaces. In other embodiments, aspects may also be applied to other applications involving any type of electronic interface or drive circuits according to any fashion as known in the art.

According to embodiments described herein, a driver has an increased rise-fall time with a decreased propagation delay. In electronic circuits, rapid transitions may be more affected by parasitic line inductance and/or capacitance, such as when switching at high frequencies. In order to reduce such parasitic behaviors, it may be beneficial to increase the rise or fall time during switching. According to embodiments, a driver system may include a pre-driver circuit to increase the rise-fall time by controlling a capacitance within the driver to control data transitions.

A capacitance that effects rise-fall time may also alter a propagation delay introduced by the driver circuit. According to embodiments described herein, a variable capacitance is used within a driver system to reduce propagation delay and increase rise-fall time. The capacitance may be controlled to be small during an initial portion of a transition and large during a final portion of the transition. Thus, according to various embodiments, an output signal is able to change quickly, reducing propagation delay, when a first capacitance is applied until a transition point and to change more slowly when a second capacitance is applied after the transition point. Thus, a driver is presented with a variable capacitance that allows the driver to have both a decreased propagation delay and an increased rise-fall time.

Figure 1:
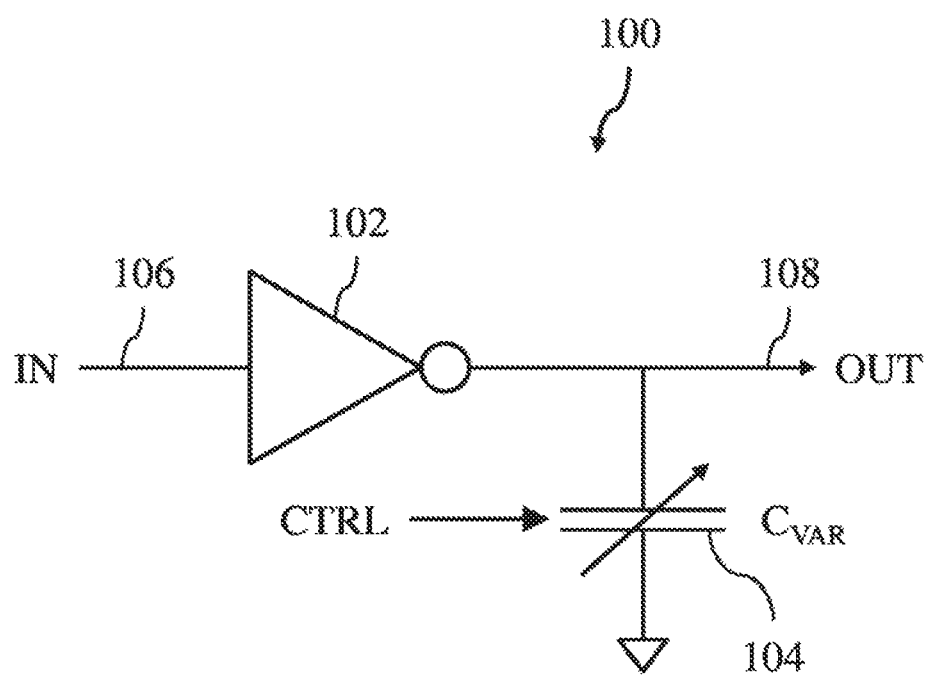
FIG. 1 illustrates a schematic of an embodiment driver (e.g., pre-driver) circuit.

FIG. 1 illustrates a schematic of an embodiment driver circuit 100 including a driver 102 and a capacitance element 104 with a variable capacitance $C_{VAR}$. The driver 102 can be either inverting or non-inverting depending upon the application. As discussed below with respect to FIG. 5, the driver 102 can be implemented as a pre-driver.

According to various embodiments, driver 102 receives an input signal IN on terminal 106 and supplies an output signal OUT on terminal 108. Capacitor 104 may determine the output capacitance $C_{VAR}$ on terminal 108 and may be altered using a control signal CTRL. The output capacitance $C_{VAR}$ affects the rise-fall time of output signal OUT and the propagation delay of driver circuit 100. In some embodiments, the output capacitance $C_{VAR}$ is controlled such that the value of output signal OUT changes quickly, but does not reach a final value as quickly because the output capacitance $C_{VAR}$ is altered during a transition. In such embodiments, a propagation delay may be decreased while a rise-fall time is increased.

Figure 2A:
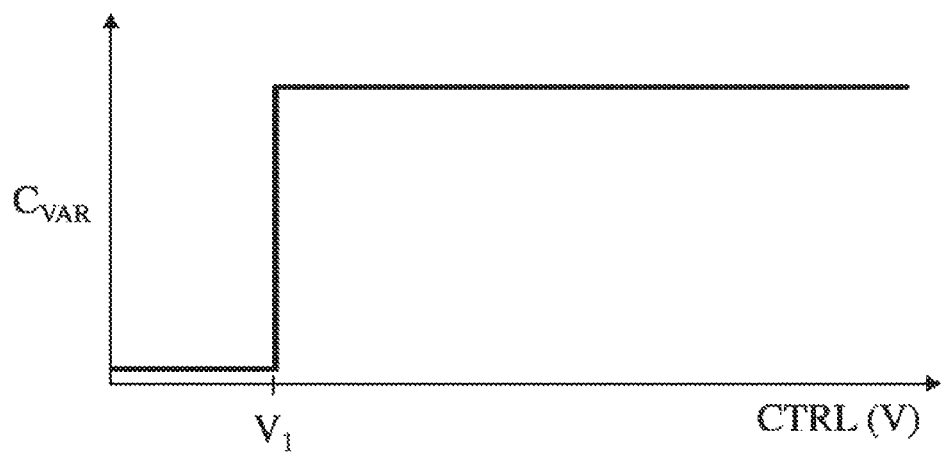
FIGS. 2a-2c illustrate capacitance plots for an embodiment driver circuit.
Figure 2B:
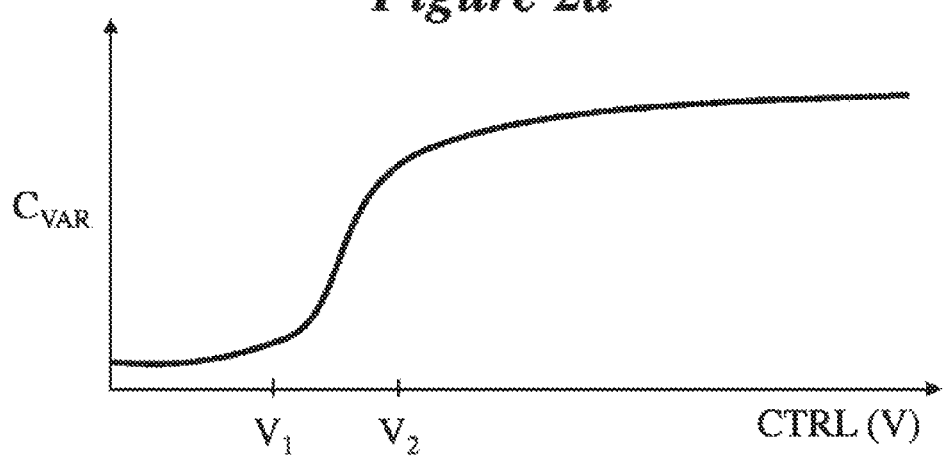
Figure 2C:
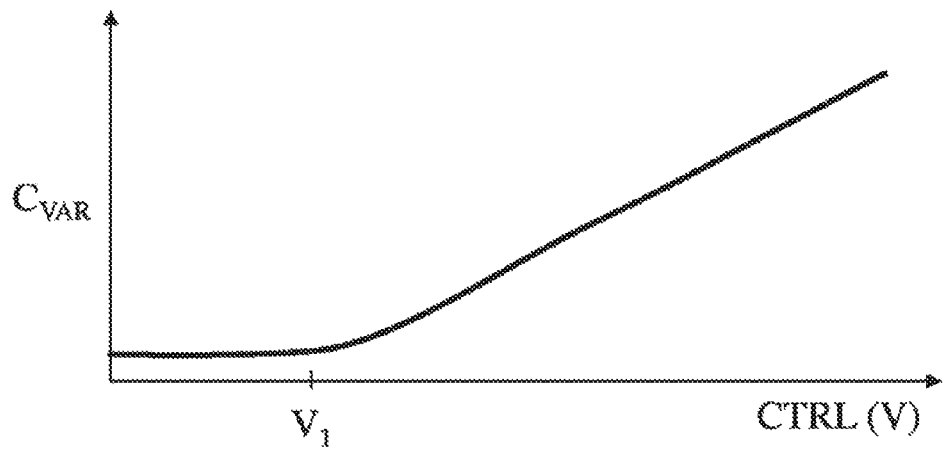

For further explanation, FIGS. 2a-2c illustrate capacitance plots for the embodiment driver circuit 100 and the output capacitance $C_{VAR}$. As shown, the vertical axis of the plots in FIGS. 2a-2c depicts output capacitance $C_{VAR}$ and the horizontal axis depicts the control signal CTRL. In various embodiments, control signal CTRL is a voltage. In other embodiments, control signal CTRL may be implemented as a different type of signal, such as a current control signal, for example.

According to the embodiment shown in FIG. 2a, the output capacitance $C_{VAR}$ is controlled in a way similar to a step function. During a first time period until control signal CTRL reaches $V_1$, the output capacitance $C_{VAR}$ is a small value. In some embodiments, the output capacitance $C_{VAR}$ is negligible or zero during the first time period. As shown, after control signal CTRL reaches $V_1$, the output capacitance $C_{VAR}$ increases to a larger value.

Referring to FIGS. 1 and 2a, driver circuit 100 may be operated to supply an output line on a bus and components connected thereto, for example. As discussed briefly above, transitions on the bus line may exhibit LC characteristics caused by non-ideal parasitic inductances or capacitances of interconnecting lines. In order to reduce the LC parasitic behavior, the rise-fall time is increased by the large output capacitance $C_{VAR}$. Consequently, in order to prevent the propagation delay of driver circuit 100 from increasing, the output capacitance $C_{VAR}$ is decreased. Thus, FIG. 2a shows how the output capacitance $C_{VAR}$ is decreased during a first time when the output signal OUT is transitioning. Reducing the output capacitance $C_{VAR}$ allows the output signal OUT to transition very quickly. During a second portion of the transition, the output capacitance $C_{VAR}$ is increased in order to increase the rise-fall time of the full transition of output signal OUT.

FIG. 2b illustrates another embodiment capacitance plot. As shown, the output capacitance $C_{VAR}$ may exhibit other control characteristics compared to FIG. 2a. In such embodiments, the output capacitance $C_{VAR}$ changes slightly until the control signal CTRL reaches a voltage $V_1$, changes quickly as the control signal moves between voltages $V_1$ and $V_2$, and then changes more slowly after $V_2$, as shown in FIG. 2b.

FIG. 2c illustrates a further embodiment capacitance plot. As shown, the output capacitance $C_{VAR}$ may be substantially constant at a low level until the control signal CTRL reaches $V_1$ and then may increases linearly as the control signal CTRL is increased thereafter. FIGS. 2a-2c are illustrative embodiments of various control schemes for the variable output capacitance $C_{VAR}$ and are meant to show examples of the types of control relationships possible between the variable output capacitance $C_{VAR}$ and the control signal CTRL. Other examples are also possible.

Figure 3A:
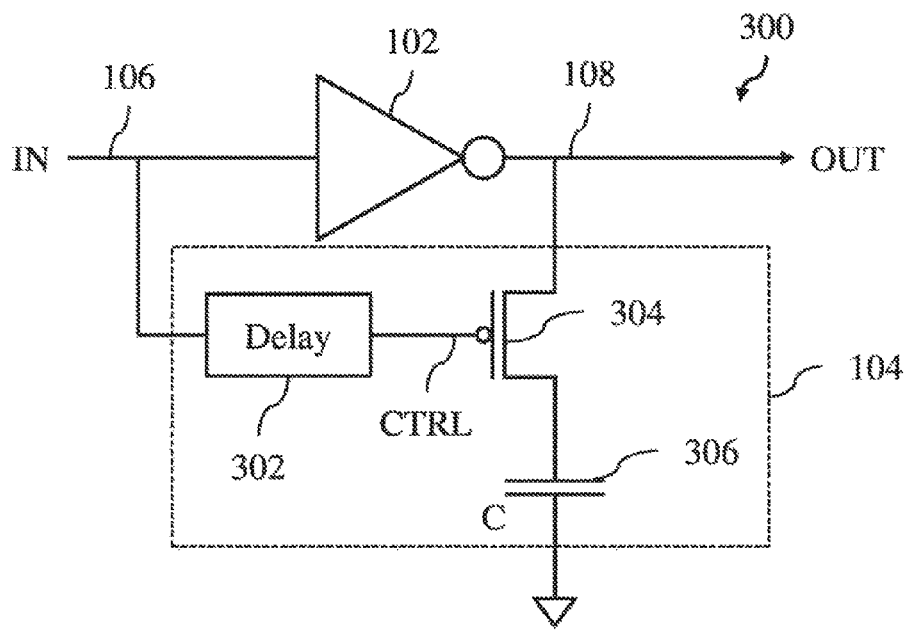
FIG. 3a illustrates a schematic of an additional embodiment driver circuit and FIG. 3b illustrates a timing diagram of the additional embodiment driver circuit.
Figure 3B:
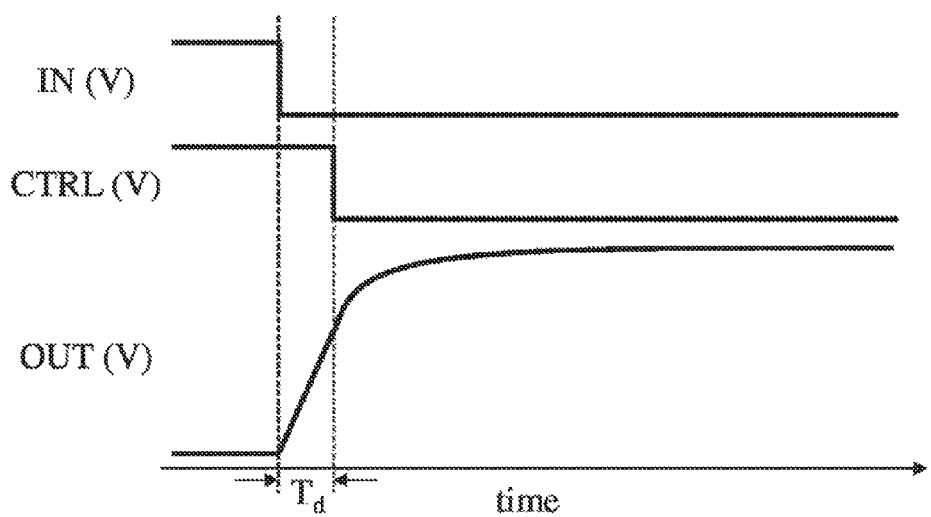

FIG. 3a illustrates a schematic of an additional embodiment driver circuit 300 that includes driver 102 and an implementation of variable capacitor 104 including delay block 302, transistor 304, and capacitor 306. In this embodiment, driver 102 is an inverting driver. As shown, delay block 302, transistor 304, and capacitor 306 are included in variable capacitor 104 and are one embodiment implementation. According to various embodiments, an input signal IN on terminal 106 triggers delay block 302 to turn-on transistor 304 after a delay time $T_d$ (FIG. 3b). When transistor 304 is turned on, i.e. in a conducting state, the capacitance C of capacitor 306 is coupled to output terminal 108 with output signal OUT. In various embodiments, driver circuit 300 produces an output capacitance similar or identical to the output capacitance shown in FIG. 2a. Delay block 302 may be activated by a logic value of 1 or 0 in various embodiments and may be implemented as any known inverting or non-inverting delay block. In some embodiments, delay block 302 includes a series of any number of inverters, depending on the length of delay chosen. Capacitor 306 may be implemented as any type of capacitor and transistor 304 may be implemented as any type of transistor, such as a MOSFET, BJT, IGFET, FinFET, or FD-SOI transistor, for example.

FIG. 3b illustrates a timing diagram of the additional embodiment driver circuit 300. According to various embodiments, input signal IN transitions from a high level to a low level. Immediately after input signal IN transitions, output signal OUT begins to rapidly increase from 0 to 1 during delay time $T_d$, during which time there is zero or negligible capacitance coupled to output terminal 108. After delay time $T_d$, which is generated by delay block 302, control signal CTRL, which is coupled to a control terminal of transistor 304, transitions from a high level to a low level and supplies an on-level activation signal to transistor 304. After control signal CTRL turns transistor 304 on, capacitor 306 is coupled to output terminal 108 causing a capacitively slowed change in output signal OUT.

Figure 4A:
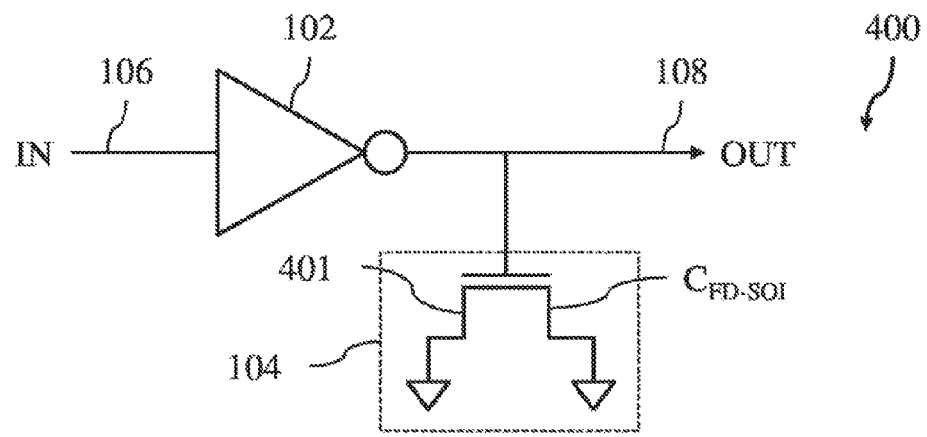
FIG. 4a illustrates a schematic of a further embodiment driver circuit.

FIG. 4a illustrates a schematic of a further embodiment driver circuit 400 that includes driver 102 and an implementation of variable capacitor 104 coupled to output terminal 108. According to various embodiments, variable capacitor 104 is implemented as a fully depleted silicon-on-insulator (FD-SOI) transistor connected as FD-SOI capacitor 401 with variable capacitance $C_{FD-SOI}$.

Figure 4B:
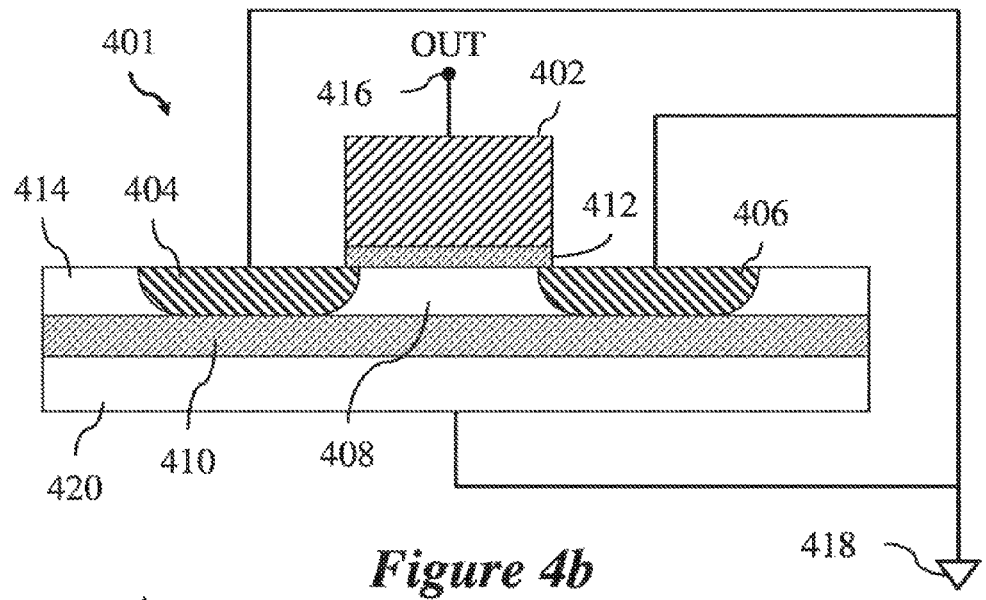
FIG. 4b illustrates a schematic of the variable capacitor for the further embodiment driver circuit.

FIG. 4b illustrates a schematic of FD-SOI capacitor 401 for the embodiment driver circuit 400. FD-SOI capacitor 401 may also correspond to variable capacitor 104 in driver circuit 100. FD-SOI capacitor 401 includes gate 402, source 404, and drain 406. An FD-SOI process forms a buried insulator 410 on top of substrate 420. Substrate 420 may be a semiconductor body formed of silicon, for example. Silicon layer 414 may be formed on buried insulator 410. As shown, an area in silicon layer 414 between source 404 and drain 406 forms channel 408, which may be fully depleted of charge carriers. In some embodiments, silicon layer 414 is undoped. Insulation layer 412 separates channel 408 from gate 402.

According to various embodiments, source 404 and drain 406 may be raised above the level of silicon layer 414. Additionally, gate 402 may be insulated on its vertical sidewalls. In some particular embodiments, silicon layer 414 is less than 100 nm thick. In further embodiments, silicon layer 414 is less than 15 nm thick. Similarly, buried insulator 410 may be less than 200 nm thick. Further, buried insulator 410 may be less than 30 nm thick. Insulation layer 412 may be less than 50 nm, or less than 10 nm in further embodiments. In other embodiments, silicon layer 414, insulation layer 412, and buried insulator 410 may be any thickness.

In various embodiments, when a voltage above a certain threshold is applied to gate 402 through terminal 416 an inversion layer forms in channel 408. Terminal 416 may correspond to terminal 108 with output signal OUT in FIG. 1. A characteristic of FD-SOI is the variable capacitance that is formed between channel 408 and gate 402. In some embodiments, when an inversion layer is formed in channel 408, a large capacitance develops across insulation layer 412. However, when no inversion layer is formed, a negligible or small capacitance is present across insulation layer 412.

Figure 4C:
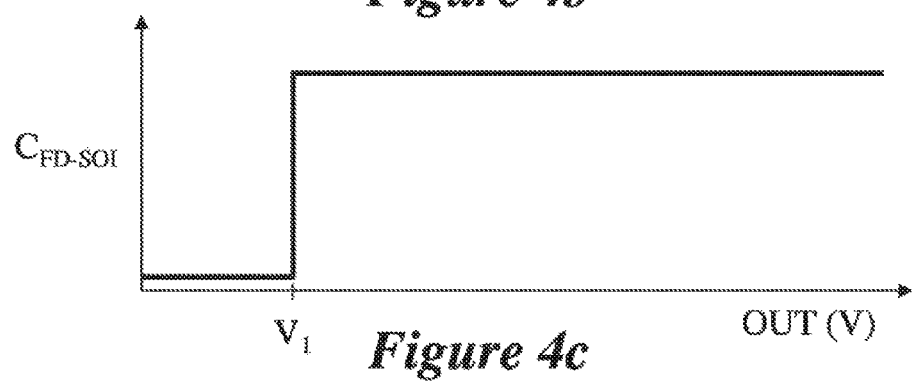
FIG. 4c illustrates an additional capacitance plot showing a characteristic FD-SOI capacitance.

FIG. 4c illustrates an additional capacitance plot showing a characteristic FD-SOI capacitance $C_{FD-SOI}$. According to various embodiments, when a voltage below the turn-on voltage $V_1$ is applied, the capacitance $C_{FD-SOI}$ of capacitor 401 is zero or small. When a voltage above the turn-on voltage $V_1$ is applied, capacitance $C_{FD-SOI}$ is raised to a large value as shown. According to the embodiments shown in FIGS. 4a and 4b, the voltage is applied from output terminal 108 through terminal 416. Thus, the applied voltage is equal to output signal OUT, as shown by the capacitance plot in FIG. 4c. The shape of the capacitance $C_{FD-SOI}$ may result from the feature that channel 408 is fully depleted. If no inversion layer forms in channel 408, there is no charge available for the bottom "plate" of the effective capacitor, which causes the effective capacitance to be very small or near zero. If an inversion layer forms in channel 408, a large amount of charge may be available for the bottom "plate" of the effective capacitor, which causes the effective capacitance to be large.

As shown in FIG. 4b, channel 408 with source 404 and drain 406 are coupled together to reference terminal 418. Thus, variable capacitor 104 is formed between terminals 416 and 418. Substrate 420 may be connected to a same reference terminal 418 as shown. In other embodiments, substrate 420 may be connected to another terminal or reference voltage. In various embodiments, reference terminal 418 may be a positive supply voltage VDD, negative supply voltage VSS, or a ground connection GND.

Figure 5:
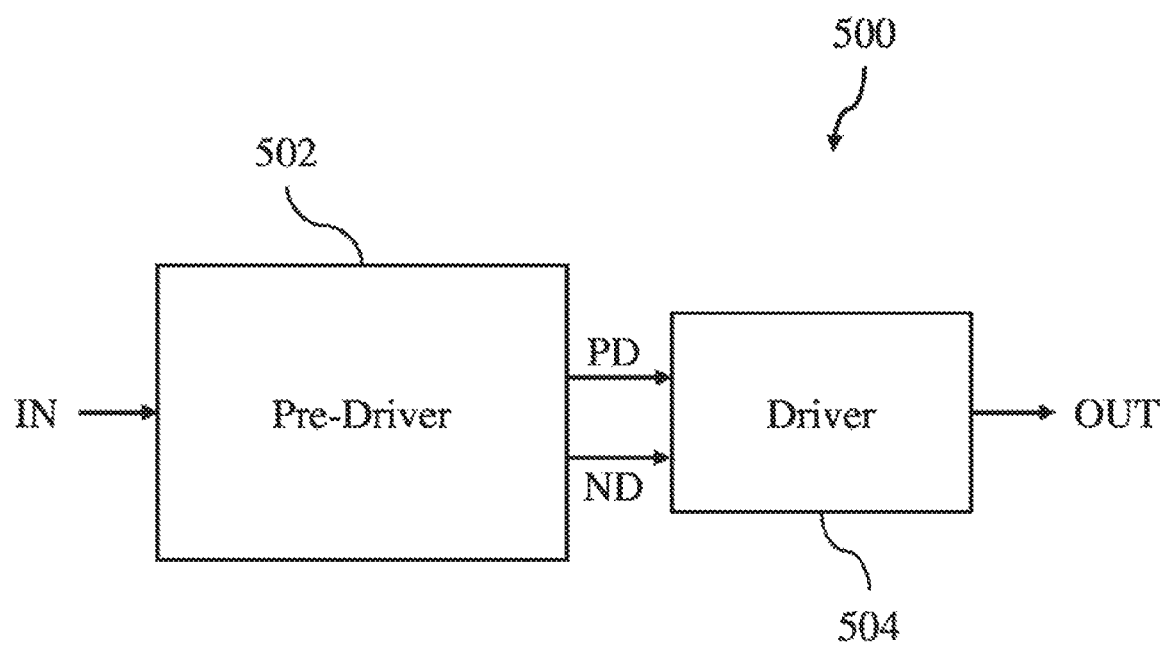
FIG. 5 illustrates a block diagram of an embodiment pre-driver and driver system.

FIG. 5 illustrates a block diagram of an embodiment pre-driver and driver system 500 including pre-driver 502 and driver 504. Driver 504 may be configured to receive drive signals PD and ND from pre-driver 502 and provide an output signal OUT. Pre-driver 502 may receive an input control signal IN and produce drive signals PD and ND. Drive signal PD may be a PMOS drive signal and drive signal ND may be an NMOS drive signal. The circuits described with respect to FIGS. 1-4 can be used as the pre-driver 502.

In but one example, pre-driver 502 can be implemented as a three-phase motor pre-driver for automotive applications. For a three-phase motor, three of the circuits 502 would be included, one circuit driving each of the three phases of the motor. In one example, the pre-driver could be designed to control six external MOSFETs in bridge configuration to drive three-phase motors in automotive applications. All gate driver outputs could be controlled by separate inputs.

Figure 6:
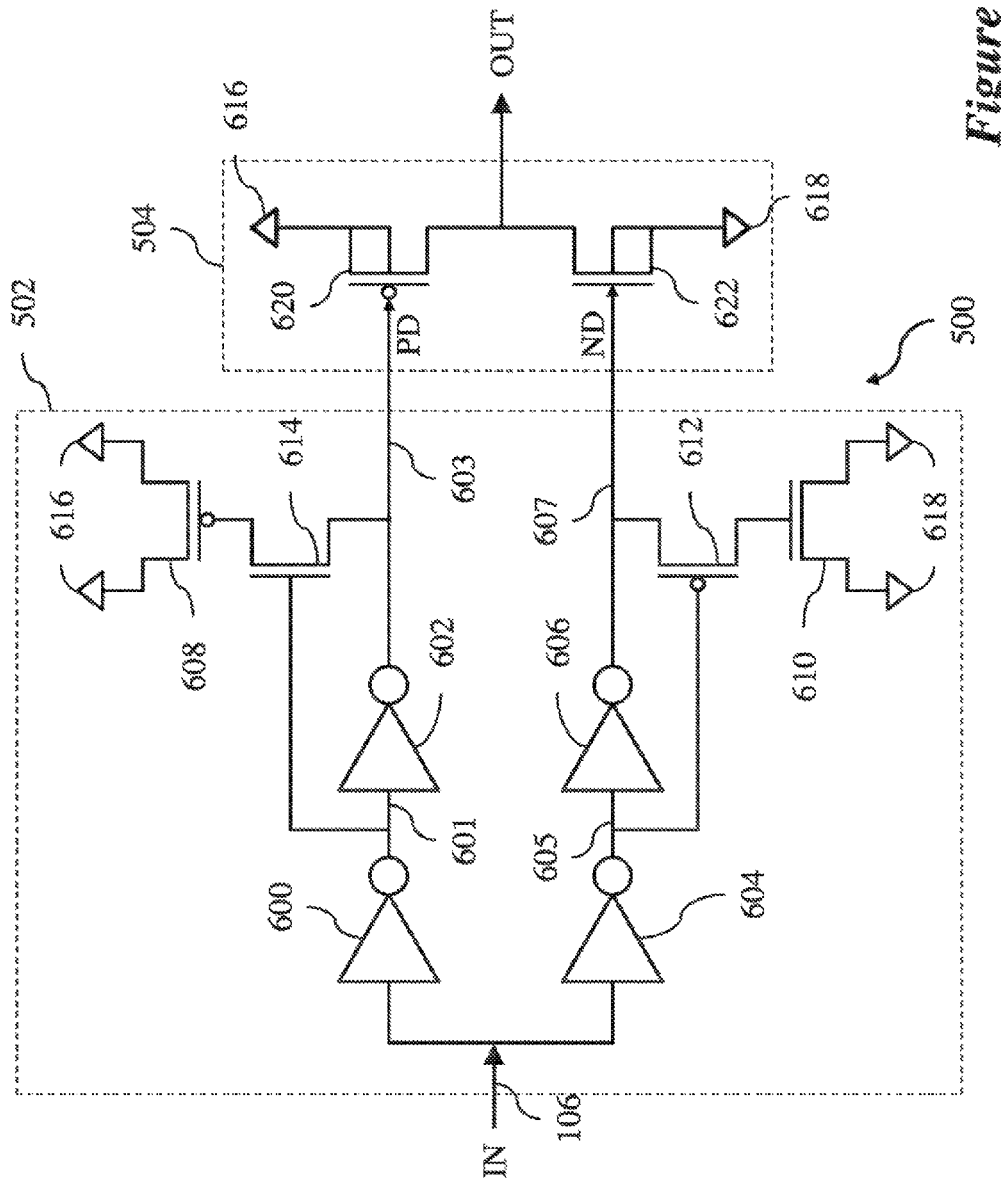
FIG. 6 illustrates a circuit diagram of an embodiment pre-driver and driver system.

FIG. 6 illustrates a circuit diagram of an embodiment pre-driver and driver system 500 including implementations of pre-driver 502 and driver 504 according to one embodiment. As shown, driver 504 may be implemented as PMOS transistor 620 and NMOS transistor 622, which have a conduction path coupled in series between reference terminal 616 and reference terminal 618. In various embodiments, reference terminal 616 may be a positive supply voltage VDD and reference terminal 618 may be a negative supply voltage VSS or a ground connection GND. The node between PMOS transistor 620 and NMOS transistor 622 supplies output signal OUT, which may be coupled to a bus line or an off chip component, for example. PMOS transistor 620 is controlled at drive terminal 603 by drive signal PD and NMOS transistor 622 is controlled at drive terminal 607 by drive signal ND.

According to various embodiments, pre-driver 502 may be implemented with buffers 600-606. As shown, buffers 600-606 are inverters. Drive signal PD may have two cascaded inverters 600 and 602 and drive signal ND may have two cascaded inverters 604 and 606, as shown. Thus, in the embodiment shown, input signal IN is not inverted and is conveyed to PMOS transistor 620 and NMOS transistor 622 of driver 502. In other embodiments, any combination of buffers may be used, inverting or non-inverting.

A transistor connected as variable capacitor 608 may be coupled to drive terminal 603 through NMOS transistor 614 and a transistor connected as variable capacitor 610 may be coupled to drive terminal 607 through PMOS transistor 612, as shown. According to an embodiment, NMOS transistor 614 and PMOS transistor 612 are controlled at their respective control terminals by signals coupled to a node between buffers 600 and 602, for NMOS transistor 614, and between buffers 604 and 606, for PMOS transistor 612, as shown. According to various embodiments, variable capacitors 608 and 610 are implemented as FD-SOI capacitors as described in reference to FIG. 3. In the embodiment shown, variable capacitor 608 is a p-type FD-SOI capacitor and variable capacitor 610 is an n-type FD-SOI capacitor. In further embodiments, all transistors in FIG. 6 are implemented as FD-SOI transistors.

In various embodiments, a transition of input signal IN from 0 to 1 enables NMOS transistor 622 and disables PMOS transistor 620 by applying a logic high value drive signal ND to drive terminal 607 and a logic high drive signal PD to drive terminal 603. The transition of input signal IN causes NMOS transistor 614 to be non-conducting and to disconnect variable capacitor 608 from drive terminal 603. The same transition of input signal IN causes PMOS transistor 612 to be conducting and to connect variable capacitor 610 to drive terminal 607.

Thus, a transition of input signal IN from 0 to 1 effectively modifies the capacitance of drive terminals 603 and 607 in order to increase the capacitance of drive terminal 607 and to decrease the capacitance of drive terminal 603. Following similar logic, a transition of input signal IN in the opposite direction, from 1 to 0, effectively modifies the capacitance of drive terminals 603 and 607 in order to decrease the capacitance of drive terminal 607 and to increase the capacitance of drive terminal 603.

According to various embodiments, variable capacitors 608 and 610 have charging times and transistors 612 and 614 have turn-on times. The charging times and/or turn-on times may cause the coupling of variable capacitors 608 and 610 to drive terminals 603 and 607 to be delayed by a time delay. Thus, drive terminals 603 and 607 may drive transistors 620 and 622 during a first time period with first capacitance values and during a second time period with second capacitance values. This concept is discussed in reference to FIGS. 2a-2c and is further discussed in reference to FIG. 8 below.

In an alternative embodiment, which is not explicitly illustrated, the transistors 612 and 614 can be eliminated. In this case, the control terminals of variable capacitors 608 and 610 would be connected directly to the respective outputs of the pre-driver on terminals 603 and 607. In such an embodiment, variable capacitors 608 and 610 would be another type of controllable capacitor that receives control signals from nodes 601 and 605, respectively. As before, the capacitor 608 and 610 will operate to provide the desired capacitance value at the drive terminal during a switching transition. Thus, capacitor 608 would be controlled to have a small capacitance when NMOS transistor 622 is driven and capacitor 610 would be controlled to have a small capacitance when PMOS transistor 620 is driven. Conversely, capacitor 608 would be controlled to have a large capacitance when PMOS transistor 620 is driven and capacitor 610 would be controlled to have a large capacitance when NMOS transistor 622 is driven. This embodiment would be useful in an implementation where the delay in driving from high to low is desired to be different than the delay in driving from low to high.

Figure 7:
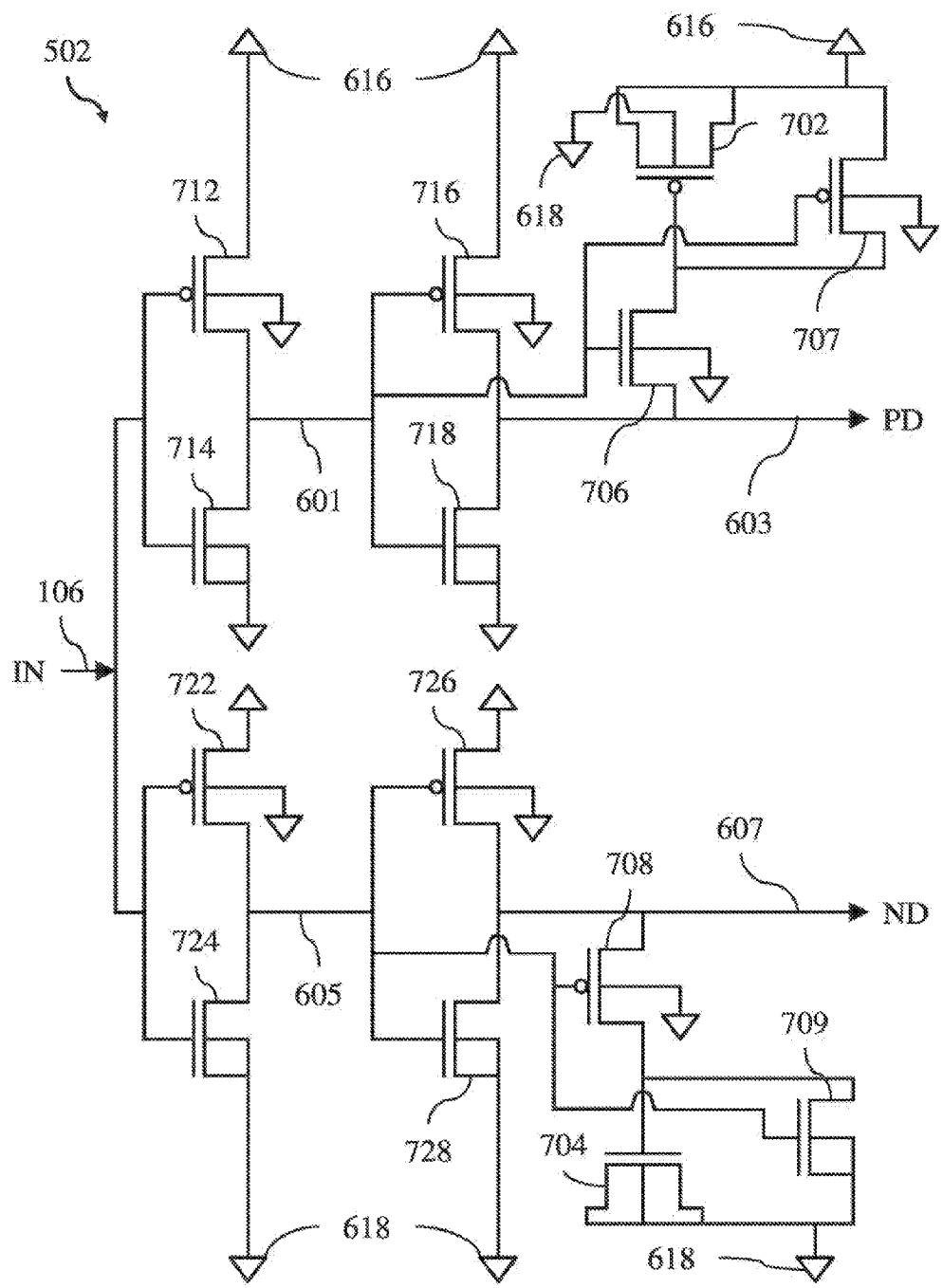
FIG. 7 illustrates a more detailed circuit diagram of another embodiment pre-driver.

FIG. 7 illustrates a more detailed circuit diagram of an implementation of pre-driver 502 having numerous FD-SOI transistors coupled as a non-inverting buffer between terminal 106 and PD and ND drive terminals 603 and 607, as described above. Transistors 712-718 may be implementations of buffers 600 and 602 and transistors 722-728 may be implementations of buffers 604 and 606. According to various embodiments, FD-SOI capacitors 702 and 704 are variable capacitors that may be coupled to PD and ND drive terminals 603 and 607 through transistors 706 and 708.

Transistors 707 and 709 may be configured to short circuit FD-SOI capacitors 702 and 704 when they are not coupled to the respective drive terminal 603 and 607. As shown, FD-SOI capacitor 702 is coupled to transistors 706 and 707 such that a control signal from intermediate terminal 601 either causes transistor 706 to couple FD-SOI capacitor 702 to PD drive terminal 603 or causes transistor 707 to form a short circuit across FD-SOI capacitor 702. Similarly, FD-SOI capacitor 704 is coupled to transistors 708 and 709 such that a control signal from intermediate terminal 605 either causes transistor 708 to couple FD-SOI capacitor 704 to ND drive terminal 607 or causes transistor 709 to form a short circuit across FD-SOI capacitor 704. In such an embodiment, FD-SOI capacitors 702 and 704 are discharged when not connected to PD and ND drive terminals 603 and 607, respectively. In various embodiments, all transistors shown in FIG. 7 are FD-SOI transistors. In alternative embodiments, all transistors shown in FIG. 7 may be implemented as any type of transistor as is known in the art.

According to various embodiments, there are two types of p-type FD-SOI devices. As shown in FIG. 7, FD-SOI capacitor 702 is a p-type device with a substrate contact coupled to a low reference terminal 618, e.g., a ground terminal GND. Another type of p-type FD-SOI device may be used for FD-SOI capacitor 702 that has a substrate contact coupled to a high reference terminal 616, e.g., a supply terminal VDD. In various embodiments, the operation of both types of p-type FD-SOI devices may be the same. In further embodiments, there are also two types of n-type FD-SOI devices.

Figure 8:
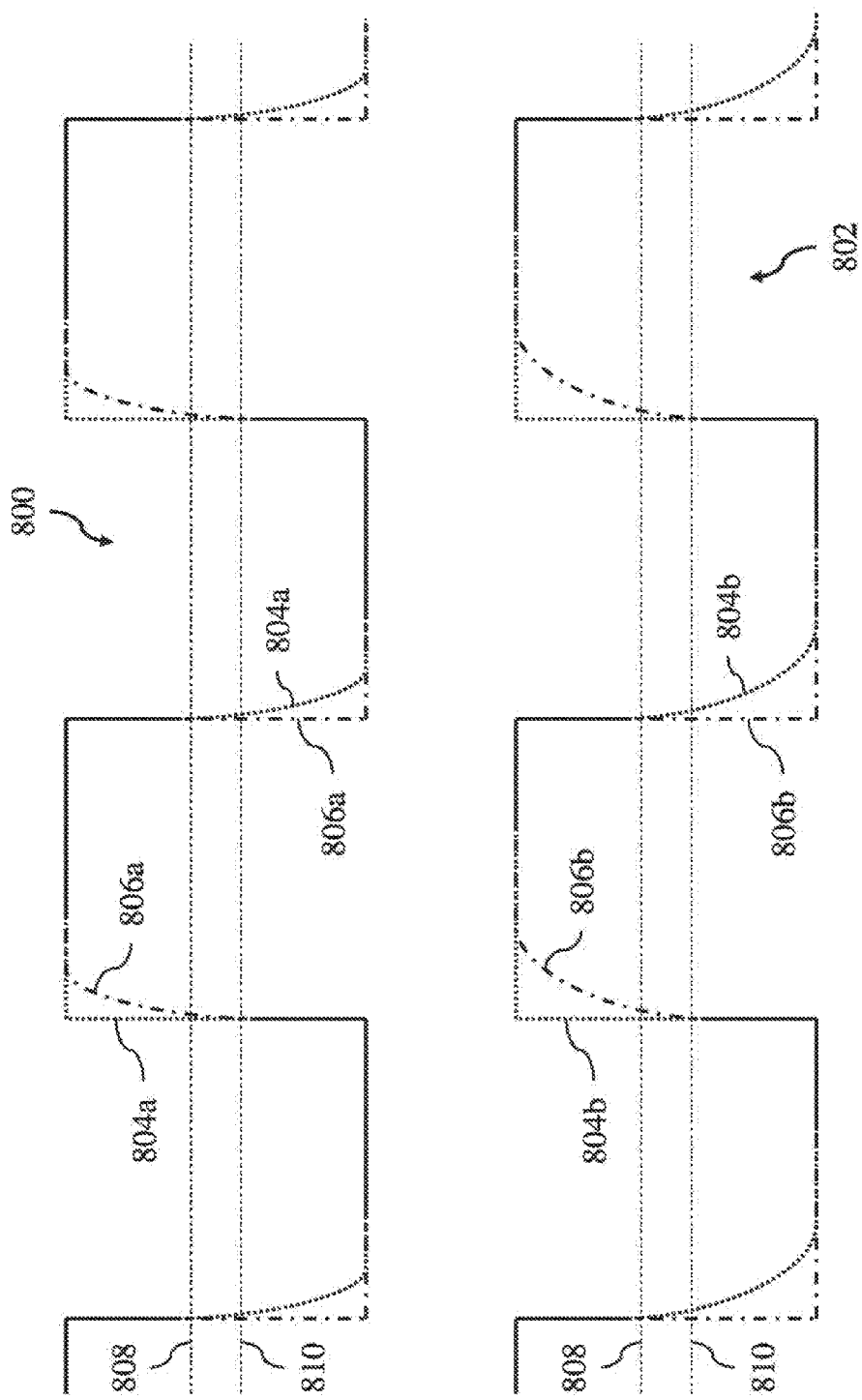
FIG. 8 illustrates waveform diagrams of outputs of embodiment pre-driver circuits.

FIG. 8 illustrates waveform diagrams 800 and 802 of outputs of embodiment pre-driver circuits. According to various embodiments, waveform diagram 800 depicts PD drive signal 804a and ND drive signal 806a and waveform diagram 802 depicts PD drive signal 804b and ND drive signal 806b. Waveform diagram 800 may correspond to a pre-driver circuit having a lower overall capacitance than the overall capacitance in the pre-driver circuit that corresponds to waveform diagram 802. In some embodiments, the vertical axis is a drive voltage and the horizontal axis is time.

In various embodiments, both waveform diagrams 800 and 802 depict a distinct change in capacitance during data transitions. For example, for PD drive signals 804a and 804b during data transitions from 1 to 0, a first portion of each transition is shown as a vertical line and a second portion shows a capacitive type charging curve. In such embodiments, the vertical line corresponds to a first time period during which zero or negligible capacitance is coupled to a drive terminal conveying PD drive signal 804a or 804b. The capacitive type charging curve then corresponds to a second time period during which a non-zero capacitance is coupled to the drive terminal conveying PD drive signal 804a or 804b.

In a like manner, for ND drive signals 806a and 806b during data transitions from 0 to 1, a first portion of each transition is shown as a vertical line and a second portion shows a capacitive type charging curve. In such embodiments, the vertical line corresponds to a first time period during which zero or negligible capacitance is coupled to a drive terminal conveying ND drive signal 806a or 806b. The capacitive type charging curve then corresponds to a second time period during which a non-zero capacitance is coupled to the drive terminal conveying ND drive signal 806*a* or 806*b*.

According to various embodiments, threshold voltage 808 is the threshold voltage for PMOS transistors in a driver, such as driver 504 for example, and threshold voltage 810 is the threshold voltage for NMOS transistors in the driver. The PMOS transistors may be turned on for voltages below threshold voltage 808 and the NMOS transistors may be turned on for voltage above threshold voltage 810. Thus, in various embodiments, during data transitions from 0 to 1 an NMOS transistor in the driver will be switched on and during transitions from 1 to 0 a PMOS transistor in the driver will be switched on during the first time period, i.e. effectively before the capacitance is coupled to the corresponding drive terminal. After the NMOS or PMOS transistor in the driver is turned on, the capacitance may be coupled to the drive terminal and slow the rise-fall time of an output signal OUT as described above. Thus, according to such embodiments, turn-on times and corresponding propagation delays are kept short while rise-fall times are increased.

Figure 9:
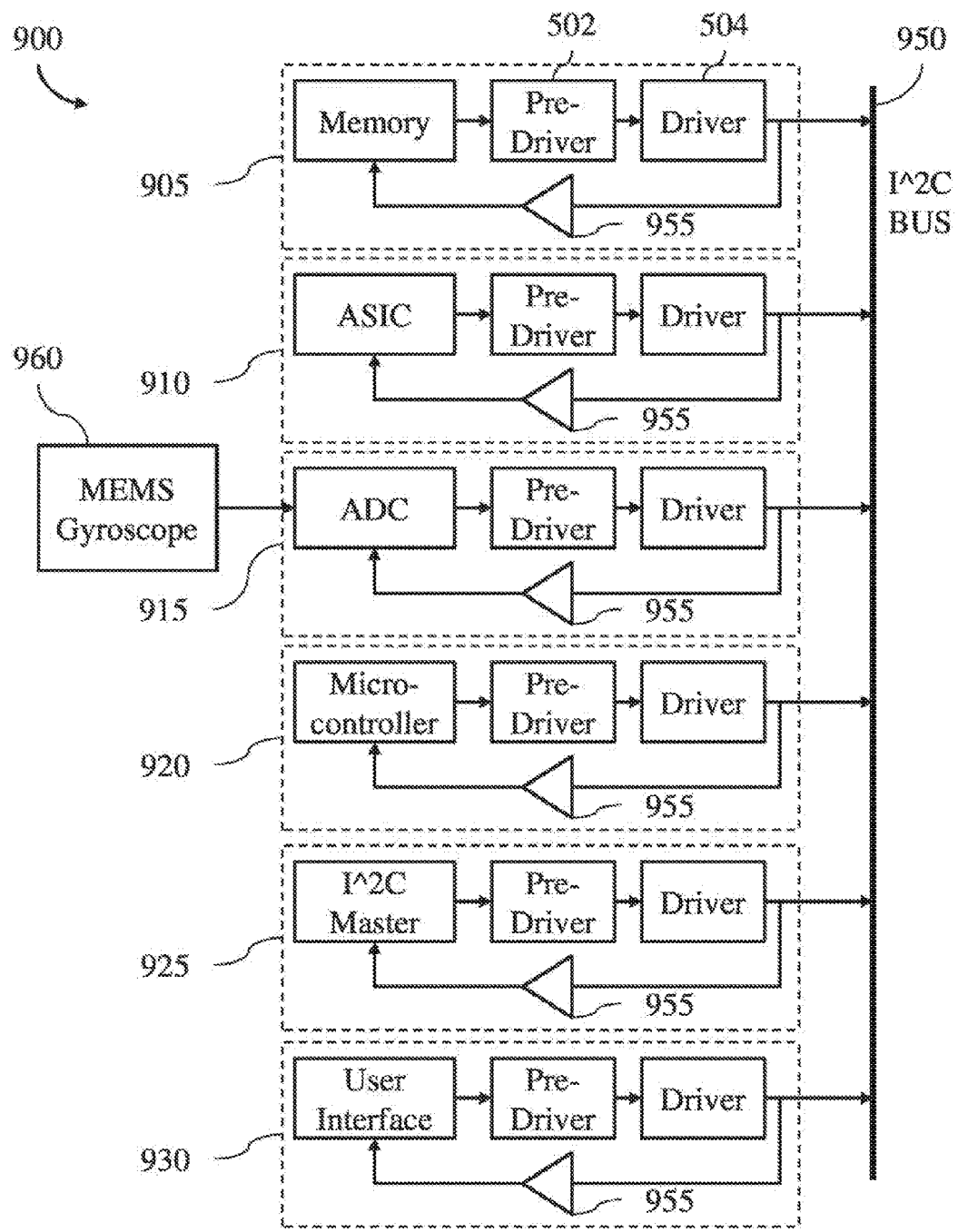
FIG. 9 illustrates a schematic of an embodiment electronic system with an interface bus.

FIG. 9 illustrates a schematic of an embodiment electronic system 900 with an interface bus 950 coupled to system components 905, 910, 915, 920, 925, and 930. Each component 905, 910, 915, 920, 925, and 930 contains a pre-driver 502 and a driver 504 according to various embodiments described herein. According to various embodiments, components 905, 910, 915, 920, 925, and 930 are merely illustrative. Additional components may be included or fewer components may be included in other embodiments. Components 905, 910, 915, 920, 925, and 930 are interfaced with interface bus 950 according to the Inter-Integrated Circuit (I$^2$C or IIC) protocol as is known in the art. In other embodiments, any other type of communication interface protocol may be used.

According to various embodiments, component 905 is a memory, component 910 is an application specific integrated circuit (ASIC), component 915 is an analog to digital converter (ADC), component 920 is a microcontroller, component 925 is I$^2$C master, and component 930 is a user interface, such as a touchscreen display. In one embodiment, these components are included in a cell-phone package and may be part of a larger system including numerous components. Each component, such as ASIC 910 includes a pre-driver 502, a driver 504, and a read buffer 955. The pre-driver 502 and driver 504 operate as described above to drive signals onto interface bus 950 and buffer 955 operates to read signals from interface bus 950. As shown, each component functions according to the I$^2$C protocol in order to receive or send data on interface bus 950.

As a further example, ADC 915 may interface with a sensor or other analog component, such as microelectromechanical system (MEMS) gyroscope 960 as shown. In various embodiments, MEMS gyroscope 960 operates to detect rotations of a system device, such as a cell phone for example, and conveys signals containing rotation information to ADC 915. ADC 915 may then convert the analog rotation signals to digital rotation signals and send the digital signals along interface bus 950 to microcontroller 920 or ASIC 910. Pre-driver 502 and driver 504 may be included in ADC 915 and convey signals from ADC 915 to interface bus 950 according to embodiments described hereinabove.

Figure 10:
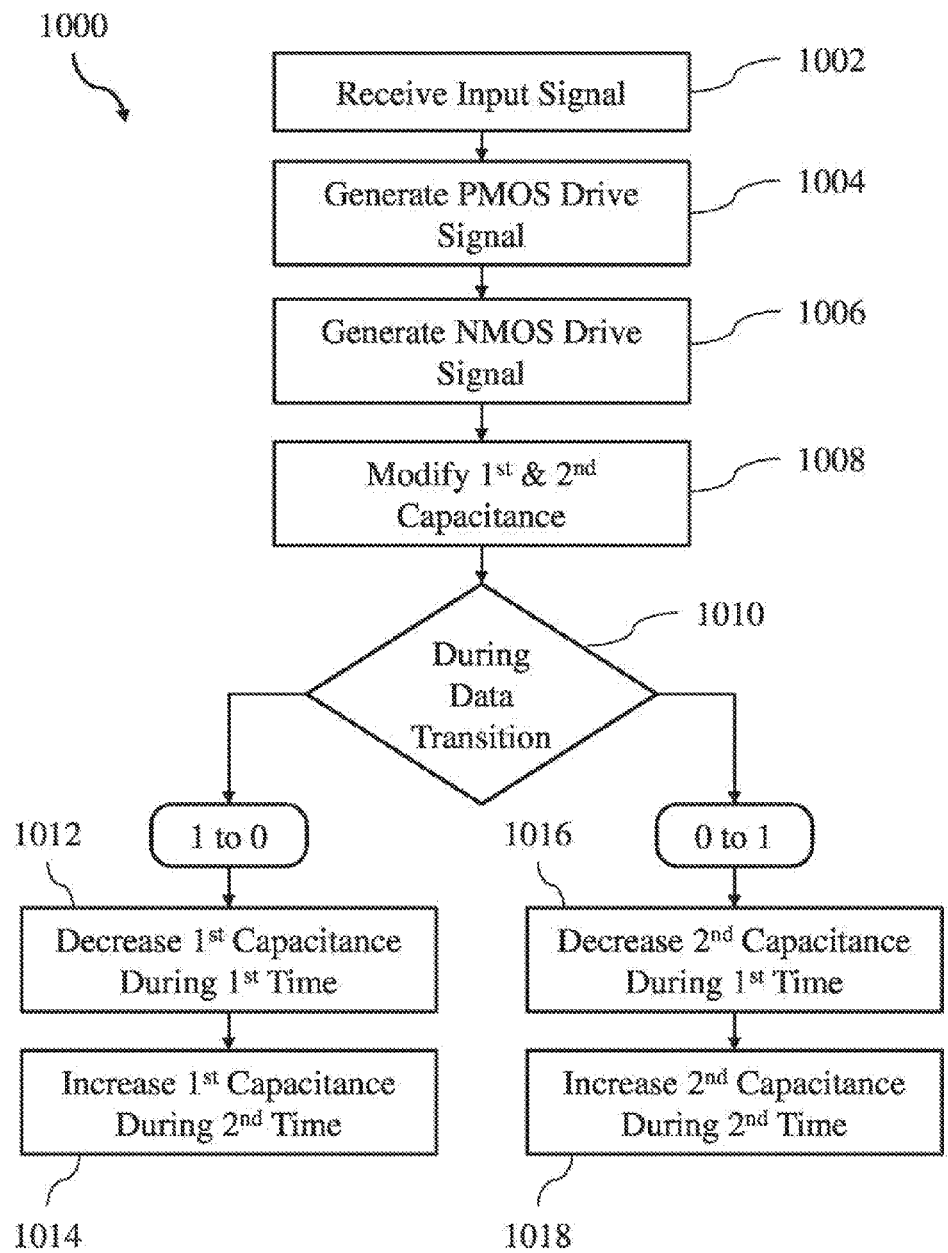
FIG. 10 illustrates a block diagram of a method of operation of an embodiment system.

FIG. 10 illustrates a block diagram of a method of operation 1000 of an embodiment system including steps 1002-1018. According to various embodiments, step 1002 includes receiving an input signal at an input to a pre-driver. Based on the input signal in step 1002, step 1004 includes generating a PMOS drive signal on a PMOS drive terminal and step 1006 includes generating an NMOS drive signal on an NMOS drive terminal. Step 1008 includes modifying a first capacitance coupled to the PMOS drive terminal and a second capacitance coupled to the NMOS drive terminal. Modifying the first and second capacitances may be performed during transitions of the PMOS and NMOS drive signals. In various embodiments, modifying the first and second capacitances in step 1008 includes steps 1010-1018. Step 1010 may include selecting a data transition type on the input signal such that during a data transition from 1 to 0 step 1012 follows step 1010 and during a data transition from 0 to 1 step 1016 follows steps 1010. For a data transition from 1 to 0, step 1012 includes decreasing the capacitance coupled to the PMOS drive terminal during a first portion of the data transition from 1 to 0. Further, step 1014 includes increasing the capacitance coupled to the PMOS drive terminal during a second portion of the data transition from 1 to 0. In further embodiments, during the data transition from 1 to 0, the capacitance coupled to the NMOS drive terminal is decreased during both the first and second portions of the data transition. For a data transition from 0 to 1, step 1016 includes decreasing the capacitance coupled to the NMOS drive terminal during a first portion of the data transition from 0 to 1. Further, step 1018 includes increasing the capacitance coupled to the NMOS drive terminal during a second portion of the data transition from 0 to 1. In further embodiments, during the data transition from 0 to 1, the capacitance coupled to the PMOS drive terminal is decreased during both the first and second portions of the data transition. In various embodiments, step 1008, which may include steps 1010-1018, may be repeated for multiple data transitions.

Advantages of embodiments described herein may include decreasing the propagation delay of a pre-driver and driver circuit and increasing the rise-fall time of a pre-driver and driver circuit. A further advantage may include decreasing the area on an integrated circuit devoted to pre-driver circuits.

An additional advantage may include removing or limiting the capacitance of a pre-driver output on a line that is not selected while increasing the capacitance of the pre-driver output on a line that is selected. In one embodiment, because the selected FD-SOI capacitor coupled to a pre-driver output matches the selected driver transistor, variations in performance of the transistor will match variations of performance of the capacitor such that variations are compensated or partially compensated. For example, variable capacitor 608 matches and compensates variations from transistor 620 and variable capacitor 610 matches and compensates variations from transistor 622.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:
1. A circuit comprising:
a driver having an input terminal and an output terminal;
a semiconductor switch having a first terminal and a second terminal, the first terminal of the semiconductor switch coupled to the output terminal of the driver; and a capacitance element coupled between the second terminal of the semiconductor switch and a power supply terminal, wherein the semiconductor switch and the capacitance element comprise a variable capacitance, wherein the variable capacitance is directly connected to the output terminal, the variable capacitance is controlled such that the variable capacitance provides a capacitance of substantially zero at the output terminal of the driver during a first portion of a data transition from a first state to a second state, and the variable capacitance provides a non-zero capacitance at the output terminal of the driver during a second portion of the data transition from the first state to the second state, wherein the second portion of the data transition begins after the first portion of the data transition ends, and wherein the first portion of the data transition ends when the semiconductor switch is turned on.

2. The circuit of claim 1, wherein the semiconductor switch comprises a transistor and the capacitance element is a capacitor.

3. The circuit of claim 1, wherein the semiconductor switch comprises a p-type transistor and the driver is an inverting driver.

4. The circuit of claim 1, wherein the first state represents a 1 and the second state represents a 0.

5. The circuit of claim 1, wherein the capacitance element comprises a MOSFET.

6. The circuit of claim 1, further comprising a delay circuit coupled to a control terminal of the semiconductor switch.

7. The circuit of claim 1, wherein the variable capacitance is controlled based on a signal of the input terminal.

8. The circuit of claim 1, wherein a change of the variable capacitance from substantially zero capacitance to the non-zero capacitance happens in a first time shorter than a duration of the first portion of the data transition in the output terminal of the driver from the first state to the second state.

9. The circuit of claim 1, wherein the capacitance element comprises an FD-SOI transistor.

10. A circuit comprising:
a driver having an input terminal and an output terminal;
a transistor directly connected to the output terminal of the driver;
a capacitance element coupled between the transistor and the power supply terminal; and
a delay circuit coupled between the input terminal and a gate of the transistor, wherein the delay circuit and the transistor are configured such that
the transistor at the output terminal of the driver is off during a first portion of a data transition from a first state to a second state, and
the transistor at the output terminal of the driver is on during a second portion of the data transition from the first state to the second state, wherein the second portion of the data transition begins after the first portion of the data transition ends.

11. The circuit of claim 10, wherein the driver is an inverting driver and the transistor is a PMOS transistor.

12. The circuit of claim 10, wherein the capacitance element comprises a capacitor.

13. The circuit of claim 10, wherein the power supply terminal is connected to ground.

14. The circuit of claim 10, wherein the delay circuit comprises an inverter.

15. The circuit of claim 10, wherein the capacitance element comprises a transistor.

16. The circuit of claim 10, wherein the first state is a high level and the second state is a low level.

17. A method of driving a terminal comprising:
receiving an input signal;
generating an output signal at the terminal based on the input signal; and
modifying a capacitance coupled to the terminal during a voltage transition of the output signal from a first state to a second state, wherein modifying the capacitance comprises decreasing the capacitance coupled to the terminal before a first portion of the voltage transition of the output signal begins by turning off a semiconductor switch coupled to the terminal and then increasing the capacitance coupled to the terminal during a second portion of the voltage transition of the output signal by turning on the semiconductor switch directly connected to the terminal, wherein the second portion of the voltage transition begins after the first portion of the voltage transition ends.

18. The method of claim 17, further comprising increasing a rise time of the output signal during an output signal transition from low to high.

19. The method of claim 17, wherein increasing the capacitance takes a first time shorter than a duration of the first portion of the voltage transition of the output signal from the first state to the second state.

20. The method of claim 17, wherein generating the output signal comprises inverting the input signal.

* * * * *